United States Patent [19]

Teschner et al.

[11] Patent Number: 6,096,174
[45] Date of Patent: Aug. 1, 2000

[54] APPARATUS FOR COATING A SUBSTRATE WITH THIN LAYERS

[75] Inventors: Götz Teschner, Hanau; Joachim Szczyrbowski, Goldbach, both of Germany

[73] Assignee: Leybold Systems GmbH, Hanau am Main, Germany

[21] Appl. No.: 08/990,953

[22] Filed: Dec. 15, 1997

[30] Foreign Application Priority Data

Dec. 13, 1996 [DE] Germany .............................. 196 51 811

[51] Int. Cl.[7] .............................. C23C 14/32; C23C 14/54
[52] U.S. Cl. .................................. 204/192.12; 204/298.08
[58] Field of Search .......................... 204/298.08, 192.12

[56] References Cited

U.S. PATENT DOCUMENTS

| | | |
|---|---|---|
| 4,902,394 | 2/1990 | Kenmotsu et al. . |
| 5,082,546 | 1/1992 | Szczyrbowski et al. . |
| 5,241,152 | 8/1993 | Anderson et al. . |
| 5,281,321 | 1/1994 | Sturmer et al. ..................... 204/298.08 |
| 5,286,360 | 2/1994 | Szczyrbowski et al. . |
| 5,399,252 | 3/1995 | Schmerer et al. . |
| 5,611,899 | 3/1997 | Maass ................................. 204/298.08 |
| 5,807,470 | 9/1998 | Szczyrbowski et al. .......... 204/298.08 |

FOREIGN PATENT DOCUMENTS

| | | |
|---|---|---|
| 252 205 | 12/1987 | German Dem. Rep. . |
| 40 42 287 | 7/1992 | Germany . |
| 42 02 425 | 8/1993 | Germany . |
| 42 37 517 | 5/1994 | Germany . |
| 44 38 463 | 2/1996 | Germany . |
| 195 06 515 | 3/1996 | Germany . |
| 42 42 633 | 11/1996 | Germany . |
| 195 06 513 | 12/1996 | Germany . |

OTHER PUBLICATIONS

Derwent record for DD 252 205, month and year unknown.
Derwent record for DE 195 06 515, month and year unknown.
Derwent record for DE 195 060 513, month and year unknown.
Derwent record for DE 44 38 463, month and year unknown.
Derwent record for DE 42 42 633, month and year unknown.

Primary Examiner—Robert J. Warden, Sr.
Assistant Examiner—Kaj K. Olsen
Attorney, Agent, or Firm—Fulbright & Jaworski, LLP

[57] ABSTRACT

An apparatus is provided for coating a substrate (24) with thin layers from targets (12, 13) between which a gas discharge plasma is sustained in order to produce the ions necessary for the bombardment of the targets (12, 13) connected to alternating current. The process chamber (6) contains a gas under a specific partial pressure. The targets (12, 13) are connected to a power source in such a circuit so that they alternately form the cathode and anode of the gas discharge. The reversal of the current direction is performed through an H bridge (4) formed of four switches (16 to 19), the conductor (14) connecting the H bridge (4) to a first power source (3) being connected through a branch line (21) to a second power source which can be connected by a switch (20) to ground. All switches (19 to 20) are operated by a control circuit in a regular and variable mode, the ion energy being controlled by the level of the potential difference between the cathode and the coating and the number of ions through the duration of this potential

5 Claims, 5 Drawing Sheets

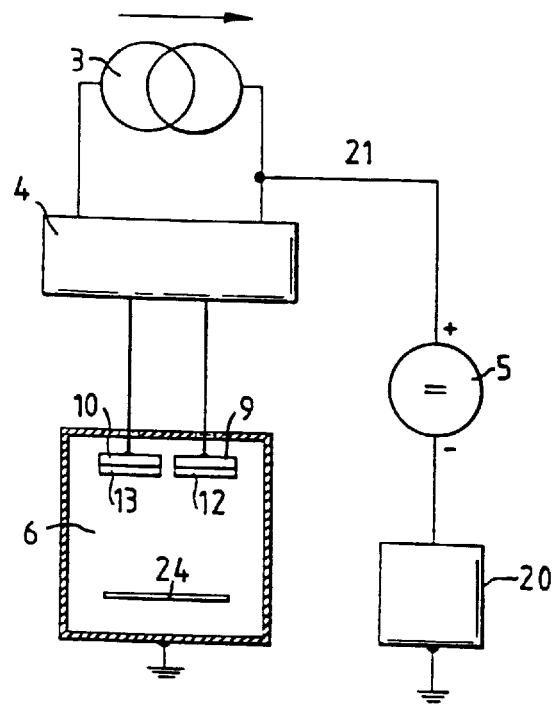
FIG.1
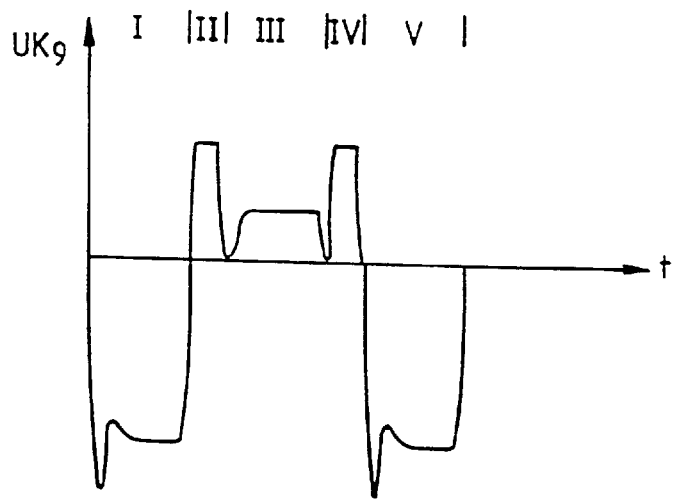
FIG.2
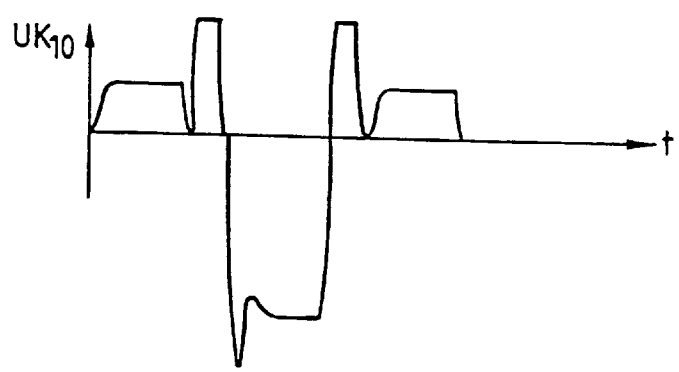

APPARATUS FOR COATING A SUBSTRATE WITH THIN LAYERS

FIELD OF THE INVENTION

The invention relates to an apparatus for coating a substrate with thin layers from targets between which a gas discharge plasma is maintained in order to produce the ions necessary for the bombardment of targets connected to alternating current, the process chamber containing a gas under a certain partial pressure, and the targets are connected to a current source and being wired so that they form alternately the cathode and anode of the gas discharge.

BRIEF DESCRIPTION OF THE PRIOR ART

An apparatus is known for the reactive coating of a substrate (DE-A-41 36 655.7, addition to DE-A-40 42 289.5) in which a cathode consisting of two electrically separate parts and configured as a magnetron cathode, in which the target base with yoke and magnet is connected as the one part—with the interposition of a capacitance—to the negative pole of a direct-current voltage supply and the target as the other part is connected to the voltage supply with interposition of a choke and a resistance parallel to the latter, the target being connected through an additional capacitance to the plus pole of the power supply and to the anode which in turn is connected to ground—with interposition of a resistance, while in series with the low-induction capacitance an inductance is inserted into the branch line to the resistance and to the choke and the value of the resistance is typically between 2 k$\Omega$ and 10 k$\Omega$.

This older apparatus is so constructed that it suppresses most of the arcs occurring during the coating process, reduces the energy of the arcs and improves the reignition of the plasma after arcing.

In another older patent application (P 41 27 504.7) a circuit has also been created for extinguishing arcs in plasma apparatus for the purpose of permitting high coating rates even in the sputtering of difficult materials, such as $SiO_2$, for example. The momentary value of the voltage of the plasma section is compared with a voltage which corresponds to an average plasma voltage obtained over a given period, and then, if the difference between the momentary value of the plasma voltage exceeds a given level, the plasma section is cut off from the voltage source.

In the reactive sputtering of metal oxides or metal nitride, the development of more or less good insulating properties on the target surface cannot be avoided. Such insulating coatings on the target are in plasma contact and therefore take on an electrical charge. On account of the high electrical field strengths in these thin coatings, electrical breakdowns occur. In this manner an arc is initialized. The consequences are a spot destruction of the target and thus coating defects on the substrate.

In medium-frequency sputtering (as described for example in DE-A-41 38 793 and DE-A-41 38 794) it has been found that spontaneous arcing occurs less frequently than in normal DC sputtering. The peculiarity of the known process is that the cathodes are reverse-charged periodically in step with the medium frequency.

Also known is an apparatus for coating a substrate, especially with electrically non-conductive coatings (DE-A-42 02 425), from an electrically conductive target in a reactive (e.g., oxidizing) atmosphere, consisting of a direct-current source which is connected to a cathode disposed in an evacuable coating chamber and including a magnet, which cooperates electrically with the target, which is sputtered and its sputtered particles deposit themselves on the substrate, an anode electrically separated from the sputtering chamber being provided, and a DC magnetron cathode connected to a DC current source can be brought for short time periods to a positive potential by means of a matched additional circuit, the frequency of this periodical pole reversal being variable according to the coating that is to be deposited.

SUMMARY OF THE INVENTION

Setting out from the experience with apparatus for medium-frequency sputtering of thin coatings, the present invention is addressed to the problem of improving an apparatus of the type in question such that, in coating very large-area substrates, a strong and uniform ion bombardment will be achieved without the use of expensive power supplies, while the ion bombardment itself is to be controllable.

This problem is solved according to the invention by an apparatus in which the reversal of the direction of the current is performed through an H bridge formed by four switches, whose diagonal points are connected each with a magnetron cathode, each bearing a target, a line branching from the first conductor connecting the bridge with the first voltage source and connected with the positive pole of a voltage source or of a charge storage whose minus pole is connected by a fifth switch to the process chamber, and a second conductor connects the first voltage source to a choke and the choke is connected with a bridge, and all switches are operated by a control circuit in a periodic and adjustable mode.

In an alternative embodiment the reversing of the current direction is performed through an H bridge whose diagonal points are connected each with a magnetron cathode, each bearing a target, while a line branches from the first conductor joining the bridge to the first voltage source and is connected to the positive pole of a voltage source or charge storage means whose negative pole is connected to the process chamber via a fifth switch, and a second conductor connects the first voltage source with the bridge, while a second charge storage is connected to the first and second conductor, and all switches are operated by a control circuit in a regular and variable mode.

Additional details and features of the invention will become apparent from the specification herein.

BRIEF DESCRIPTION OF THE DRAWINGS

The invention admits of a great variety of embodiments; four of them are represented in a purely schematic manner in the appended drawings, wherein:

FIG. 1 shows a greatly simplified block diagram of an apparatus of the kind in question;

FIG. 2 shows the current pattern of various phases of the circuit of FIG. 1;

DETAILED DESCRIPTION

Figure 3:
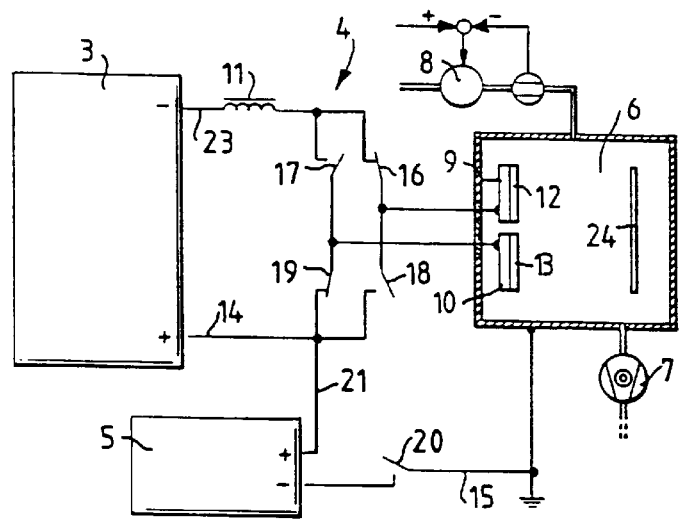
FIGS. 3–5 show the electrical circuit diagram with an H bridge connected to a first power source and preceding the two electrodes, a second power source, and a choke in the neutral line of the bridge.

The schematic diagram in FIG. 1 consists of a first power source 3, a vacuum chamber 6 with the electrodes 9 and 10 disposed therein with targets 12 and 13 and the substrate 24, a circuit 4 and a second power source 5. The conductor connected to the electrode 9 is connected by the circuit 4 and the line 21 to the second power source 5 and by switch 20 to the ground when the circuit 4 in phase II (see FIG. 2) short-circuits the power source 3.

Figure 4:
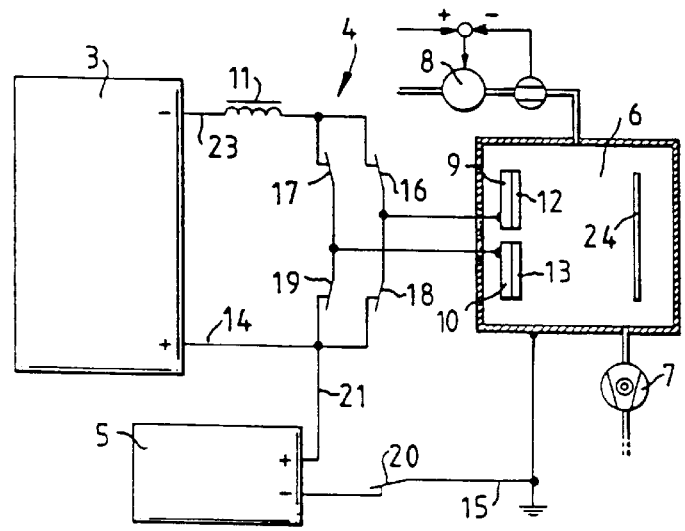
Figure 5:
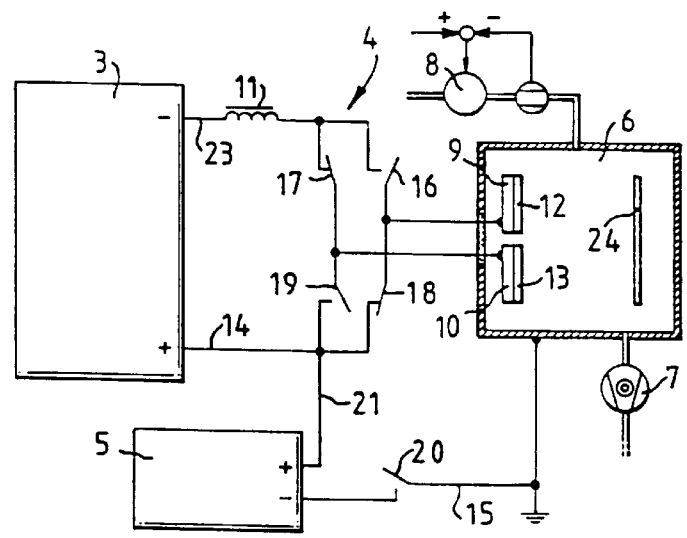

The circuit according to FIGS. 3 to 5 consists of the generator 3, the bridge circuit 4 electrically connected to the latter, the second generator 5, the vacuum chamber 6 with vacuum pump 7, gas inlet valve 8, the two electrodes 9, 10, with corresponding targets 12, 13, the choke 11, the ground conductor 15 and the switches 16 to 20. During the sputtering process the IGBT switches 16 to 20 are operated by a control circuit, not shown, according to a regular and variable mode in the three phases represented in the drawings (FIGS. 3 to 5), so that the targets 12, 13 alternately form the cathode and anode of the gas discharge.

As FIG. 3 shows, the current flows from the generator 3 through the conductor 14 and the switch 19 to the electrode 10 with target 13, while the second power source 5 is uncoupled from the electrodes 12, 13, since the switch 20 inserted into the branch line 21, as well as switch 18 of the H bridge are open. The current is limited in this period by the choke 11 in the power supply.

In FIG. 4 is shown the next phase of the sputtering process, in which all of the switches 16 to 19 of the H bridge, and also switch 20, are closed. This pause period in the discharge is utilized in order to connect the two electrodes 9 and 10 by the switch 20 to an external power source 5. The duration of the pause, and thus the ion acceleration time, is selected such that the majority of the ions has covered the distance from the electrodes 9 and 10 to the substrate 24. Since the duration is also variable by the setting of the switches, both the energy through the external voltage source 5 and the number of ions can be selected by the timing.

Figure 6:
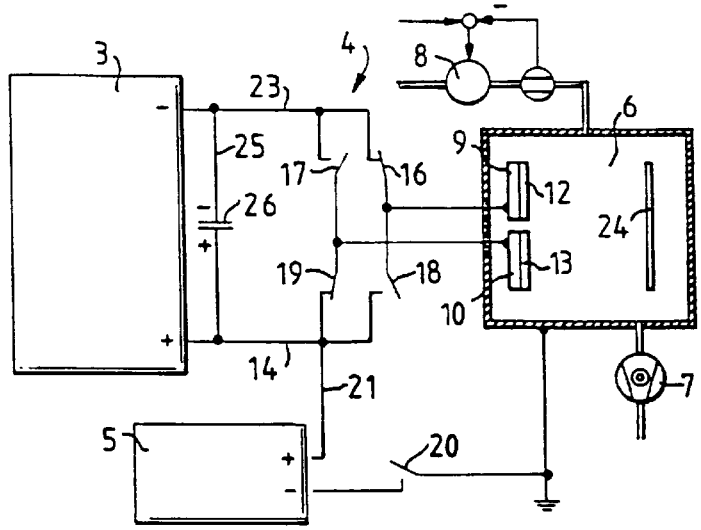
FIGS. 6–8 show a circuit similar to those in FIGS. 3 to 5, but with a capacitor inserted between the power line and negative pole.
Figure 7:
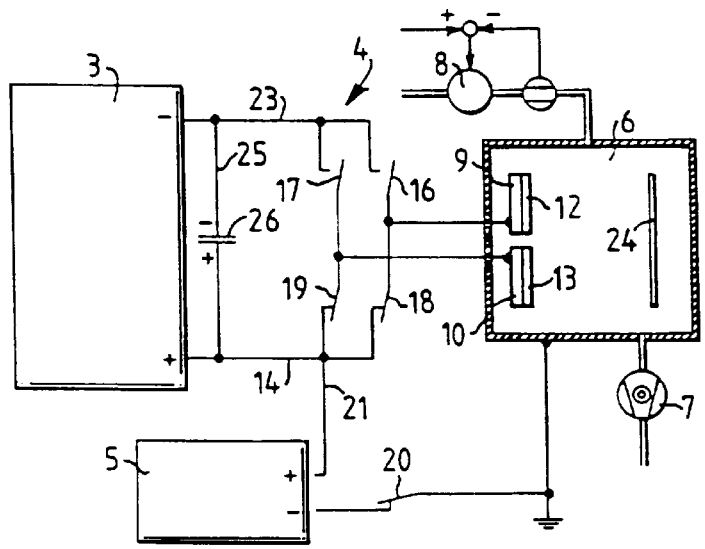
Figure 8:
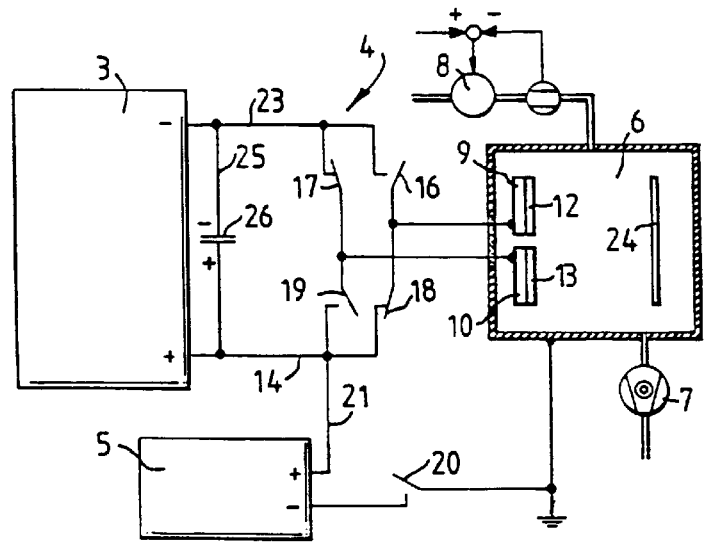

The same circuit can also be made for a voltage pulser, like the one represented in FIGS. 6 to 8, in which case the corresponding circuit differs from those in FIGS. 1 to 3 in that the two conductors 14 and 23 are connected by a line 25 to a capacitor 26 inserted into the latter. Furthermore, the choke br limiting t he current in the embodiment according to FIGS. 1 to 3 is lacking.

Figure 9:
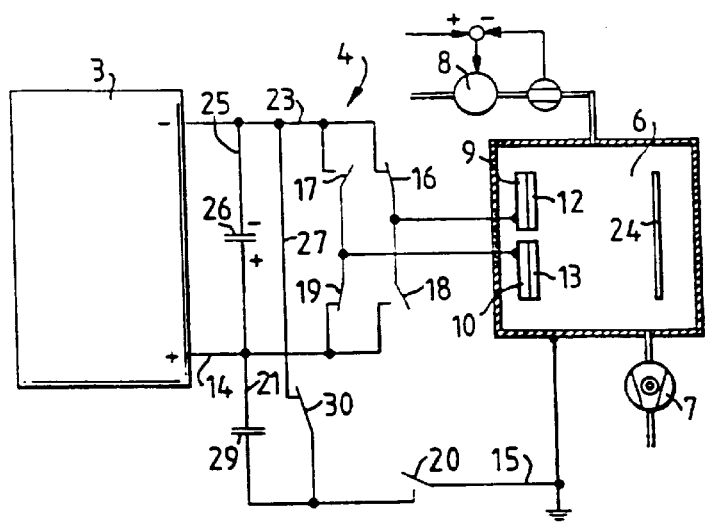
FIGS. 9–11 show a circuit similar to that of FIGS. 6 to 8, but with a second power source in the form of a condenser.
Figure 10:
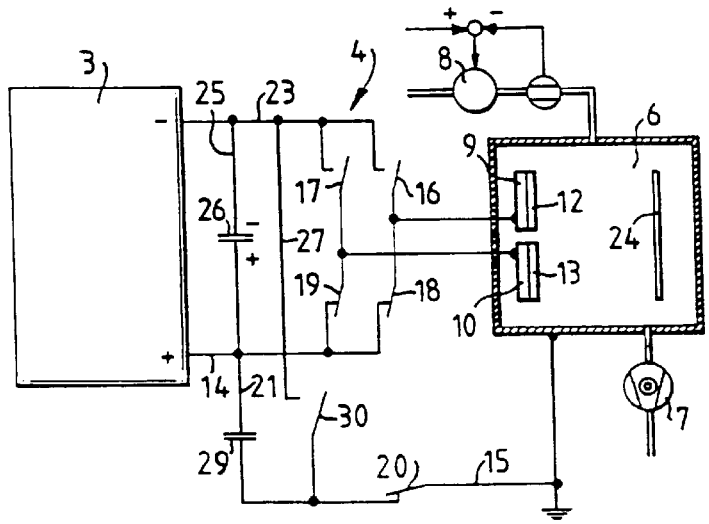
Figure 11:
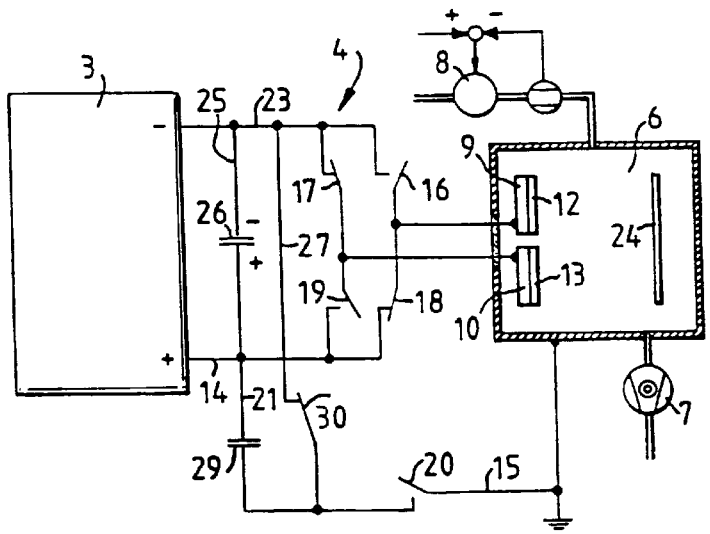

FIGS. 9 to 11 show another variant, in which the external power source 5 is replaced with a condenser 29. During the sputtering period the condenser 29 is charged, and during the pauses the energy stored in the condenser 29 is used to accelerate the ions to the substrate 24. This variant limits the freedom of the acceleration voltage, but for some applications this makes possible a more economical construction. The negative pole of the first voltage source 3 is connected through a branch line 27 with switch 30 to the conductor 15 to the process chamber 6, and all the switches (16 to 19, 20, 28, 30) are operated by a control circuit in a regular and variable mode.

Figure 12:
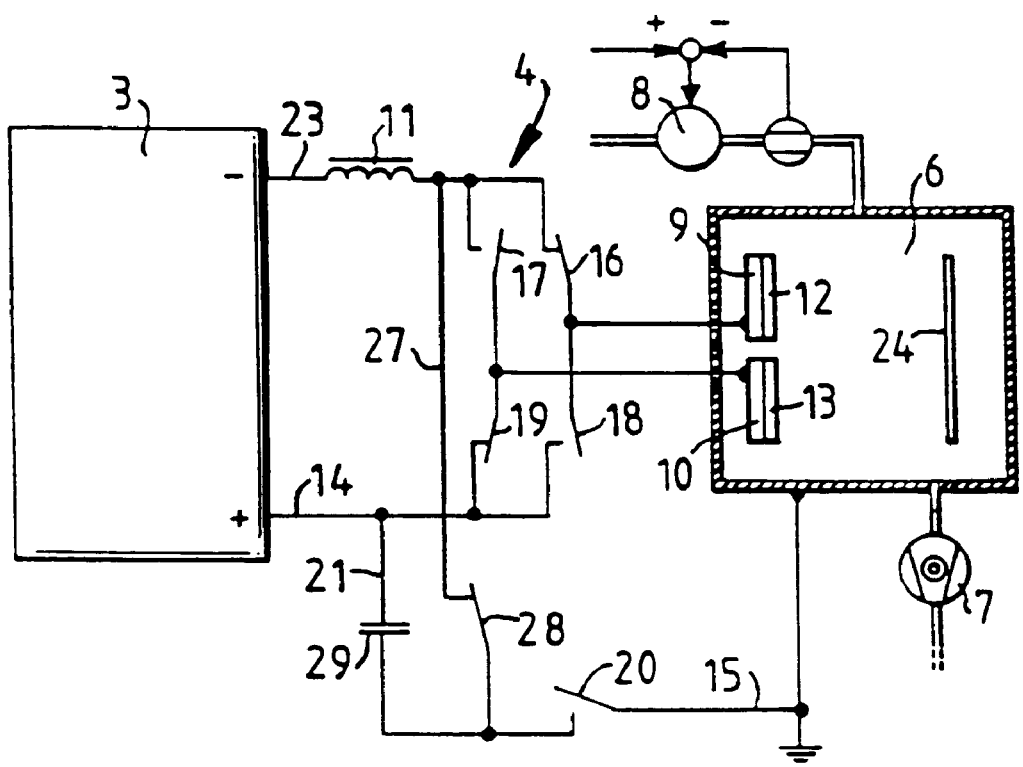
FIG. 12 shows a circuit similar to that of FIGS. 3 to 5 with a second power source configured as a condenser.

FIG. 12 shows the simplified circuit wit h the condenser 29 in the current pulser version.

To intensity the ion bombardment, known solutions make use either of separate ion sources, e.g., the APS, or a bias voltage in sputtering. While separate ion sources have their main disadvantage in the ion distribution, i.e., they are not selectable on large surfaces, the problem with bringing in a bias voltage consists, especially in the case of large glass surfaces, in installing high-frequency electrodes of large surface are a and corresponding powers. The said problems are the reason why no ion intensification has been used heretofore in large-area coating. In the conventional medium frequency discharge in the double magnetron system, a natural acceleration voltage establishes itself, which can be varied only within narrow limits depending on the other parameters. The range of variation is not sufficient for a great number of applications in which a drastic structural change is needed.

The solution offered by the invention, however, has the advantage that the acceleration voltage can be selected independently of other process parameters, so that for the first time certain coatings can now be produced on large areas.

What is claimed is:

1. An apparatus for coating a substrate with a layer by cathode sputtering, said apparatus comprising:

a process chamber containing a gas under a partial pressure, said process chamber supporting therein magnetron cathodes supporting respective targets for sputtering;

a first voltage source for applying between the targets a voltage so as to sustain a gas discharge plasma to produce the ions necessary for said cathode sputtering;

a circuit portion connecting the power source with the targets so that each target alternately forms the cathode and anode of the gas discharge;

said circuit portion including an H bridge causing a reversal of current direction flowing to and from said targets;

said H bridge comprising four switches and having two pairs of diagonal points each connected with a respective magnetron cathode supporting a respective target;

a first conductor connecting a one portion of the H bridge to the positive pole of first voltage source, a second conductor connecting the positive pole of the first voltage source to an another portion of the H bridge, said second conductor including a choke; and a third conductor which branches from said first conductor being connected to the positive pole of a voltage means comprising a second voltage source or a charge storage means, said voltage means having a negative pole connected through a fifth switch to the process chamber, and said switches being operated by a control circuit in a regular and variable mode.

2. An apparatus for coating a substrate with a layer by cathode sputtering, said apparatus comprising:

a process chamber containing a gas under a partial pressure, said process chamber supporting therein magnetron cathodes supporting respective targets for sputtering;

a first voltage source for applying between the targets a voltage so as to sustain a gas discharge plasma to produce the ions necessary for said cathode sputtering, said first voltage source having a positive pole;

a circuit portion connecting the power source with the targets so that each target alternately forms the cathode and anode of the gas discharge;

said circuit portion including an H bridge causing a reversal of current direction flowing to and from said targets, said H bridge comprising four switches and having two pairs of diagonal points each connected with a respective magnetron cathode supporting a respective target;

a first conductor connecting a one portion of the H bridge to the positive pole of first voltage source;

a second conductor connecting the positive pole of the first voltage source to another portion of the H bridge;

a third conductor branching from the first conductor and being connected to a positive pole of a voltage means comprising a second voltage source or a charge storage means, said voltage means having a negative pole connected by a fifth switch to the process chamber;

a condenser having two poles, one of said poles being connected to the first conductor and the other pole being connected to the second conductor, and said switches being operated by a control circuit in a regular and variable mode.

3. An apparatus for coating a substrate with a layer by cathode sputtering, said apparatus comprising:

a process chamber containing a gas under a partial pressure, said process chamber supporting therein magnetron cathodes supporting respective targets for sputtering;

a first voltage source for applying between the targets a voltage so as to sustain a gas discharge plasma to produce the ions necessary for said cathode sputtering;

a circuit portion connecting the power source with the targets so that each target alternately forms the cathode and anode of the gas discharge;

said circuit portion including an H bridge causing a reversal of current direction flowing to and from said targets, said H bridge comprising four switches and having two pairs of diagonal points each connected with a respective magnetron cathode supporting a respective target;

a first conductor connecting a one portion of the H bridge to the positive pole of first voltage source;

a second conductor connecting the positive pole of the first voltage source to another portion of the H bridge;

a third conductor branching from the first conductor and being connected to a positive pole of a voltage means comprising a second voltage source or a charge storage means, said voltage means having a negative pole connected by a conductor element including a fifth switch to the process chamber, and a second charge storage means connected to the first and second conductors;

the second conductor connecting the H bridge to a negative pole of the first voltage source and being connected to the process chamber through a branch line having a switch connecting with said conductor element; and the switches being operated by a control circuit in a regular and variable mode.

4. An apparatus for coating a substrate with a layer by cathode sputtering, said apparatus comprising:

a process chamber containing a gas under a partial pressure, said process chamber supporting therein magnetron cathodes supporting respective targets for sputtering;

a first voltage source for applying between the targets a voltage so as to sustain a gas discharge plasma to produce the ions necessary for said cathode sputtering;

a circuit portion connecting the power source with the targets so that each target alternately forms the cathode and anode of the gas discharge;

said circuit portion including an H bridge causing a reversal of current direction flowing to and from said targets, said H bridge comprising four switches and having two pairs of diagonal points each connected with a respective magnetron cathode supporting a respective target;

a first conductor connecting a one portion of the H bridge to a positive pole of the first voltage source;

a second conductor branching from the positive pole of the first voltage source to another portion of the H bridge;

a third conductor branching from the first conductor and being connected to a positive pole of a voltage means comprising a second voltage source or a charge storage means, said voltage means having a negative pole connected through a fifth switch to the process chamber, and the second conductor including a choke between the first voltage source and the bridge, a sixth switch connected to a junction between the choke and the H bridge and to a junction between the fifth switch and the negative pole of the voltage means; the switches being operated by a control circuit in a regular mode.

5. A method for coating a substrate with a thin layer by means of cathode sputtering of targets on respective magnetron cathodes between which targets a voltage is applied so as to sustain a gas discharge plasma between an anode and a cathode in order to produce ions necessary for the cathode sputtering, said method comprising:

providing a process chamber with a gas under a partial pressure;

supplying electrical power from a power source to the targets so that the targets each alternately form the cathode and anode of the gas discharge; and interrupting the cathode sputtering process in a preselected rhythm for predetermined time intervals, said interrupting including creating a short circuit between the two magnetron cathodes by a bridge and applying at said short circuit a positive voltage with respect to the process chamber or the substrate, the positive voltage having a level controlled by a second voltage source or by the duration of the charging of a charge storage means.

* * * * *

UNITED STATES PATENT AND TRADEMARK OFFICE
CERTIFICATE OF CORRECTION

PATENT NO. : 6,096,174
DATED : August 1, 2000
INVENTOR(S) : Teschner et al.

It is certified that error appears in the above-identified patent and that said Letters Patent is hereby corrected as shown below:

On the cover page, in the section entitled U.S. Patent Documents, change "Schmerer" to -- Scherer --.
On the cover page, in the section entitled Other Publications, change "195 060 513" to -- 195 06 513 --.
In column 3, line 47, change "br" to -- 11 --.
In column 3, line 47, change "t he" to -- the --.
In column 4, line 3, change "are a" to -- area --.

Signed and Sealed this

Twenty-fourth Day of April, 2001

Attest:

NICHOLAS P. GODICI

*Attesting Officer*    *Acting Director of the United States Patent and Trademark Office*